(12) United States Patent
Mouli (10) Patent No.: US 10,134,738 B2
(45) Date of Patent: Nov. 20, 2018

(54) LOW POWER MEMORY DEVICE WITH JFET DEVICE STRUCTURES

(75) Inventor: Chandra Mouli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 525 days.

(21) Appl. No.: 13/604,355

(22) Filed: Sep. 5, 2012

(65) Prior Publication Data

US 2012/0329226 A1 Dec. 27, 2012

Related U.S. Application Data

(62) Division of application No. 12/333,067, filed on Dec. 11, 2008, now Pat. No. 8,278,691.

(51) Int. Cl.
| | |
|---|---|
| *H01L 27/108* | (2006.01) |
| *H01L 29/808* | (2006.01) |
| *H01L 21/762* | (2006.01) |
| *H01L 29/78* | (2006.01) |

(52) U.S. Cl.
CPC ...... *H01L 27/108* (2013.01); *H01L 21/76232* (2013.01); *H01L 27/10844* (2013.01); *H01L 29/808* (2013.01); *H01L 27/10873* (2013.01); *H01L 27/10876* (2013.01); *H01L 27/10879* (2013.01); *H01L 29/785* (2013.01); *H01L 29/8083* (2013.01)

(58) Field of Classification Search
CPC ............. H01L 21/76232; H01L 27/108; H01L 27/10844; H01L 27/10873; H01L 27/10876; H01L 27/10879; H01L 29/785; H01L 29/808; H01L 29/8083

USPC ........... 257/272, E21.409, E21.41, E21.473; 438/197, 270, 300, 514, 585

See application file for complete search history.

(56) References Cited

U.S. PATENT DOCUMENTS

| | | | |
|---|---|---|---|
| 4,423,490 A | 12/1983 | Roesner | |
| 4,612,629 A | 9/1986 | Harari | |
| 4,679,298 A | 7/1987 | Zuleeg et al. | |
| 4,939,099 A * | 7/1990 | Seacrist | H01L 21/761 257/260 |
| 5,010,025 A | 4/1991 | Solomon | |
| 5,148,247 A * | 9/1992 | Miura | H01L 21/763 257/262 |

(Continued)

FOREIGN PATENT DOCUMENTS

| | | |
|---|---|---|
| EP | 0050772 | 5/1982 |
| JP | 5129559 | 5/1993 |

(Continued)

OTHER PUBLICATIONS

U.S. Appl. No. 12/179,330, filed Jul. 24, 2008; Applicant: Chandra Mouli; Entitled: JFET Devices with PIN Gate Stacks and Methods of Making Same.

(Continued)

*Primary Examiner* — Tom Thomas
*Assistant Examiner* — Benjamin Tzu-Hung Liu
(74) *Attorney, Agent, or Firm* — Fletcher Yoder, P.C.

(57) ABSTRACT

There is provided a low power memory device with JFET device structures. Specifically, a low power memory device is provided that includes a plurality memory cells having a memory element and a JFET access device electrically coupled to the memory element. The memory cells may be isolated using diffusion based isolation.

19 Claims, 6 Drawing Sheets

(56) References Cited

U.S. PATENT DOCUMENTS

| | | | |
|---|---|---|---|
| 5,168,175 A * | 12/1992 | Endo | G05F 1/573 |
| | | | 327/430 |
| 5,243,209 A | 9/1993 | Ishii | |
| 5,321,283 A | 6/1994 | Cogan et al. | |
| 5,357,127 A | 10/1994 | Park et al. | |
| 5,364,816 A * | 11/1994 | Boos et al. | 438/172 |
| 5,378,642 A | 1/1995 | Brown et al. | |
| 5,393,998 A | 2/1995 | Ishii et al. | |
| 5,925,895 A | 7/1999 | Sriram et al. | |
| 6,174,763 B1 | 1/2001 | Beilstein et al. | |
| 6,245,607 B1 | 6/2001 | Tang et al. | |
| 6,246,083 B1 | 6/2001 | Noble | |
| 6,271,550 B1 | 8/2001 | Gehrmann | |
| 6,310,378 B1 | 10/2001 | Letavic et al. | |
| 6,313,489 B1 | 11/2001 | Letavic et al. | |
| 6,404,015 B2 | 6/2002 | Emmerik et al. | |
| 6,501,110 B1 | 12/2002 | Mukai et al. | |
| 6,503,782 B2 | 1/2003 | Casady et al. | |
| 6,767,783 B2 | 7/2004 | Casady et al. | |
| 6,936,866 B2 | 8/2005 | Deboy et al. | |
| 7,049,196 B2 | 5/2006 | Noble | |
| 7,122,411 B2 | 10/2006 | Mouli | |
| 7,199,442 B2 | 4/2007 | Shenoy | |
| 7,202,528 B2 | 4/2007 | Sankin et al. | |
| 7,286,377 B1 | 10/2007 | Pyeon | |
| 7,288,821 B2 | 10/2007 | Kwon | |
| 7,294,860 B2 | 11/2007 | Mazzola et al. | |
| 7,592,841 B2 | 9/2009 | Kapoor | |
| 7,662,679 B2 * | 2/2010 | Izumida | H01L 29/66818 |
| | | | 257/E21.394 |
| 7,772,056 B2 | 8/2010 | Miller et al. | |
| 7,829,892 B2 * | 11/2010 | Luyken et al. | 257/71 |
| 7,851,283 B2 * | 12/2010 | Anderson | H01L 29/41791 |
| | | | 438/149 |
| 7,859,065 B2 * | 12/2010 | Takeuchi et al. | 257/401 |
| 7,863,683 B2 * | 1/2011 | Kim et al. | 257/347 |
| 7,919,816 B2 * | 4/2011 | Gossner et al. | 257/355 |
| 7,956,395 B2 * | 6/2011 | Inokuchi et al. | 257/295 |
| 8,188,551 B2 * | 5/2012 | Schulz | H01L 21/82382 |
| | | | 257/401 |
| 8,420,483 B2 * | 4/2013 | Darwish | 438/270 |
| 2004/0043530 A1 * | 3/2004 | Jang et al. | 438/73 |
| 2004/0152257 A1 * | 8/2004 | Shibata | 438/253 |
| 2004/0262681 A1 * | 12/2004 | Masuoka | H01L 29/42384 |
| | | | 257/335 |
| 2005/0077574 A1 | 4/2005 | Mouli | |
| 2005/0151206 A1 * | 7/2005 | Schwerin | H01L 27/10823 |
| | | | 257/390 |
| 2005/0151218 A1 | 7/2005 | Mouli | |
| 2005/0202584 A1 * | 9/2005 | Mouli | H01L 27/1463 |
| | | | 438/48 |
| 2005/0287739 A1 * | 12/2005 | Mouli | H01L 21/765 |
| | | | 438/257 |
| 2006/0046355 A1 | 3/2006 | Parekh et al. | |
| 2006/0197129 A1 | 9/2006 | Wohlmuth | |
| 2007/0040221 A1 * | 2/2007 | Gossner | H01L 27/0288 |
| | | | 257/355 |
| 2007/0052040 A1 | 3/2007 | Schwerin | |
| 2007/0096144 A1 | 5/2007 | Kapoor et al. | |
| 2008/0062739 A1 | 3/2008 | Bill et al. | |
| 2008/0099798 A1 | 5/2008 | Kerns | |
| 2008/0265936 A1 * | 10/2008 | Vora | H01L 21/8232 |
| | | | 326/41 |
| 2008/0272407 A1 * | 11/2008 | Kapoor | H01L 29/66901 |
| | | | 257/270 |
| 2009/0057728 A1 * | 3/2009 | Boyle | G11C 7/062 |
| | | | 257/273 |
| 2009/0103352 A1 | 4/2009 | Kim | |
| 2009/0127592 A1 * | 5/2009 | El-Kareh et al. | 257/262 |

FOREIGN PATENT DOCUMENTS

| | | | | |
|---|---|---|---|---|
| TW | 200746141 A | 12/2007 | | |
| TW | 200812236 A | 3/2008 | | |
| TW | 200820265 A | 5/2008 | | |
| WO | 8808617 | 11/1988 | | |
| WO | WO 8808617 | * 11/1988 | | H01L 29/80 |
| WO | WO 8808617 A1 | * 11/1988 | | H01L 27/0605 |

OTHER PUBLICATIONS

U.S. Appl. No. 12/333,012, filed Dec. 11, 2008; Applicant: Chandra Mouli; Entitled: JFET Device Structures and Methods for Fabricating the Same.

U.S. Appl. No. 12/333,067, filed Dec. 11, 2008; Applicant: Chandra Mouli; Entitled: Low Power Memory Device with JFET Device Structures.

Dungan, T.E. et al.; One-Transistor GaAs MESFET and JFET Accessed Dynamic RAM Cells for High-Speed Medius Density Applications; IEEE Transportation on Electronic Devices; Jul. 1990, vol. 37, pp. 1599-1607.

Waldrop, J.R.; Schottky Barrier Height of Metal Contacts to P-Type Alpha 6H-SiC; J. Appl. Phys. 75 (9) 1994.

Mitleher et al.; Switching Behaviour of Fast High Voltage SiC pn—Diodes; Proceedings of 1998 International Symposium on Power Semiconductor Devices and ICs, Kyoto, pp. 127-130.

Round, S. et al.; A SiC JFET Driver for a 5 Kw, 150 KhZ Three-Phase PWM Converter; IEEE Conference, Pub. Oct. 2-6, 2005, pp. 410-416.

Funaki, T. et al.; Characterization of SiC JFET for Temperature Dependent Device Modeling; IEEE Conference, Pub. Jun. 18-22, 2006, pp. 1-6.

Chinese Office Action and Search Report dated Jun. 13, 2013 in Chinese Application No. 200980149816.8.

Chinese Office Action for Application No. 200980149816.8 dated Sep. 10, 2014.

Taiwanese Office Action for Application No. 098141013 dated Sep. 15, 2014.

TW Office Action dated Nov. 19, 2015.

* cited by examiner

LOW POWER MEMORY DEVICE WITH JFET DEVICE STRUCTURES

CROSS-REFERENCE TO RELATED APPLICATION

This application is a divisional of U.S. patent application Ser. No. 12/333,067, which was filed on Dec. 11, 2008.

BACKGROUND OF THE INVENTION

1. Field of the Invention

The present invention relates generally to semiconductor devices and, more particularly, to memory devices and junction field-effect transistor (JFET) device structures.

2. Description of the Related Art

Dynamic random access memory (DRAM) is one class of memory conventionally implemented in electronic devices. DRAM memory cells typically include an access device and a memory element. The access devices allow the transfer of charges to and from the memory elements to facilitate read and write operations in the memory device. Complementary metallic oxide semiconductor field effect transistors, commonly referred to as "CMOS" transistors, are typically used as access devices for the DRAM memory cells. The memory cells are typically arranged in a number of rows and columns to provide a memory array.

DRAM devices are dynamic because once a bit of data is written into a memory cell, the data begins to degrade. Specifically, electrical energy stored in the memory element of a DRAM memory cell may only be representative of the data for a finite period of time before the electrical energy increases or decreases and no longer represents the original data. To avoid loss of data, the memory cells are continuously refreshed or re-written. Retention time of a memory cell refers to the length of time that a memory cell is able to maintain memory before it needs to be refreshed. Typically, the retention time for requirement DRAM memory cells is 64 ms and, as such, cells are refreshed every 64 ms. If a memory cell in the memory array has a retention time less than 64 ms, the system may crash and data may be lost as bits become unreadable from the memory array. Various factors may contribute to a particular cell being unable to achieve a retention time of 64 ms.

Figure 1:
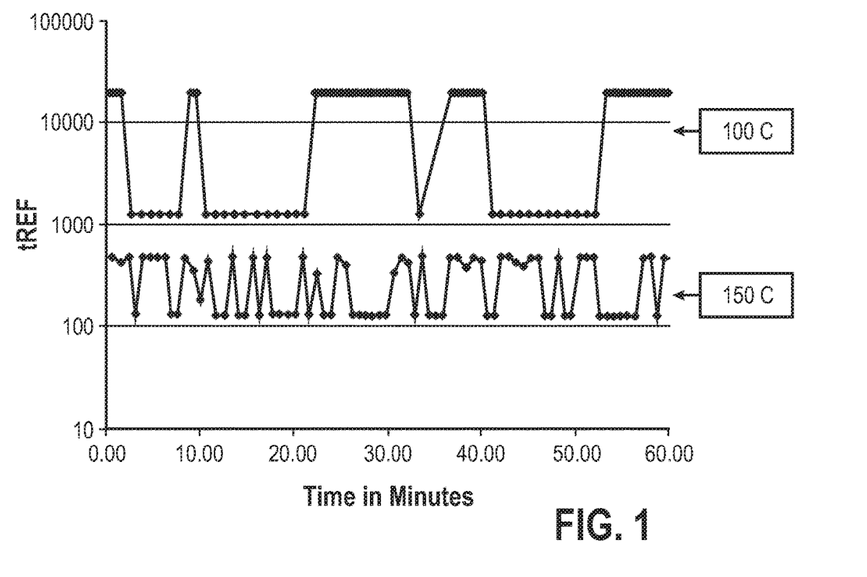
FIG. 1 illustrates bit fluctuations at 100 degrees Celsius and 150 degrees Celsius for a conventional nMOS-based DRAM memory cell.

Leakage is one possible cause of a reduced retention time. Leakage refers to a condition where electrical current flows when no current flow is expected, such as when a device is in an off state. For example, in a memory cell, leakage may refer to current flowing in and/or out of a memory elements when the access device is off. One cause of leakage in CMOS access devices are trap states. Trap states may occur when dangling bonds are created at the interface of silicon and silicon dioxide. As a result of the dangling bonds, electrons and holes may be created and recombined (generation and recombination centers) and may, therefore, prevent transistors from completely turning off. FIG. 1 illustrates a conventional nMOS-based DRAM cell exhibiting state or bit fluctuations at 100 degrees Celsius and 150 degrees Celsius. The state fluctuations may also result in unpredictable retention times. The erratic nature of the fluctuations result from electrons trapped along the interfaces between semiconductor and insulator (oxide), such as the gate oxide in CMOS access devices that has a gate oxide interface with the semiconductor channel.

In addition to leakage, CMOS access devices exhibit a high gate capacitance. This results from the gate oxide separating the gate from the channel. Gate capacitance is related to voltage, current and the speed of the access device by the following formula: $(C \times V)/I = t$; where C represents gate capacitance, V represents voltage, I represents current, and t represents time. Thus, assuming a constant voltage supply, as the current decreases or as the capacitance increases, the speed of the device slows. A higher supply voltage (Vcc) helps to offset the effects of the gate capacitance and maintain a reasonable speed for the access device.

Figure 2:
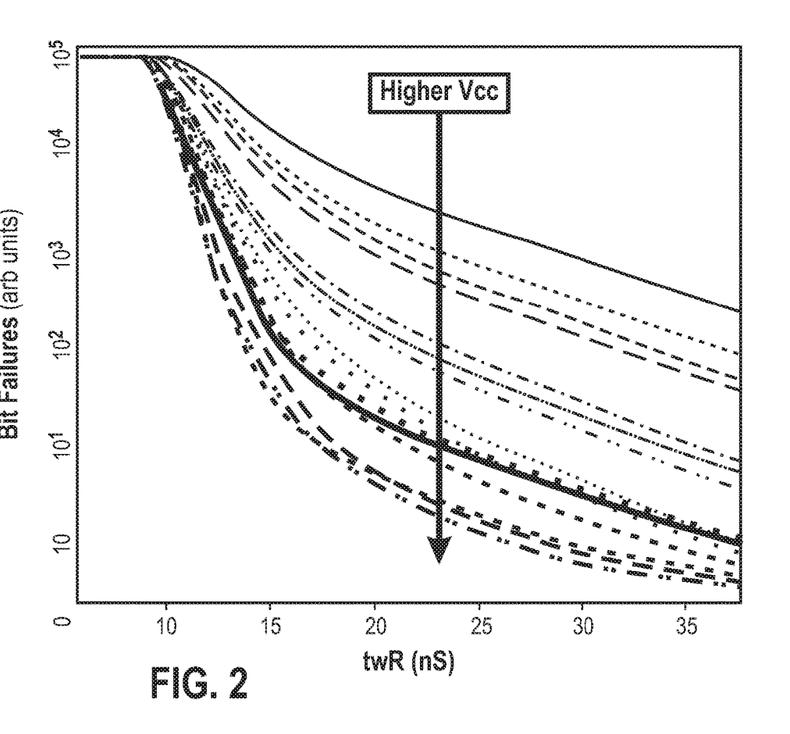
FIG. 2 is a scaled plot showing bit failures in a memory array as a function of time and voltage for a conventional nMOS-based DRAM memory cell.

Generally, the on chip power supply of DRAM memory arrays provides greater than 1.5 V Vcc. In addition to maintaining the operational speed of the access devices, a higher Vcc may result in decreased bit failures in a conventional nMOS-based DRAM cell. FIG. 2 is a scaled plot illustrating decreased bit failures in a memory array as a function of time and as a result of higher Vcc in a conventional nMOS-based DRAM memory cell. Thus, a higher Vcc provides for a higher drive current which, in turn, results in a better ability of the access device to write into the memory element. Thus, to provide fast nMOS access devices, Vcc voltages should be relatively high, i.e., greater than 1.5 V.

Because of the higher voltages required for operation of CMOS access devices, scaling of the CMOS devices may be problematic. Specifically, as the devices are scaled there may be an increase in parasitic effects between memory cells, as well as between the memory cells with other components. Additionally, as memory cells are scaled to provide for smaller and more densely packed arrays, leakage by the CMOS access devices increases. Furthermore, while it may be generally preferable to use a higher supply voltage in many applications the higher supply voltage results in higher power consumption. Embodiments of the present invention may address one or more of the issues set forth above.

BRIEF DESCRIPTION OF THE DRAWINGS

Advantages of the present invention may become apparent upon reading the following detailed description and upon reference to the drawings in which.

DETAILED DESCRIPTION OF SPECIFIC EMBODIMENTS

In accordance with embodiments of the present in invention, there is provided JFET device structures which may be implemented in DRAM memory arrays. Specifically, improved JFET device structure that may be used as access devices are described. Embodiments of the present invention accentuate the low power consumption characteristics of JFETs without compromises to short channel effects. As will be discussed in greater detail below, specific embodiments of JFET structures that achieve these goals include providing an enhancement mode nJFET structure, an nJFET recessed structure, a Fin-JFET structure, a RAD-Fin structure, a cylindrical structure, and an elevated source and drain Fin structure.

Conventional junction field effect transistors (JFETs) and devices using conventional JFETs may have characteristics that may limit their use in computing and logic designs. For example, JFETs are essentially two PN-junctions and, thus, have a relatively low forward bias turn on voltage of 600 mV. Accordingly, a conventional DRAM memory array could not be created using JFETs as any voltage applied to the gate over 600 mV would result in forward bias turn on of the PN-junctions. Thus, JFETs employ a low Vcc which may limit drive current capability. The low operating voltage may be advantageous for low power consumption and scaling of access devices if the JFET is provided with an appropriate structure, as will be discussed below.

Figure 3:
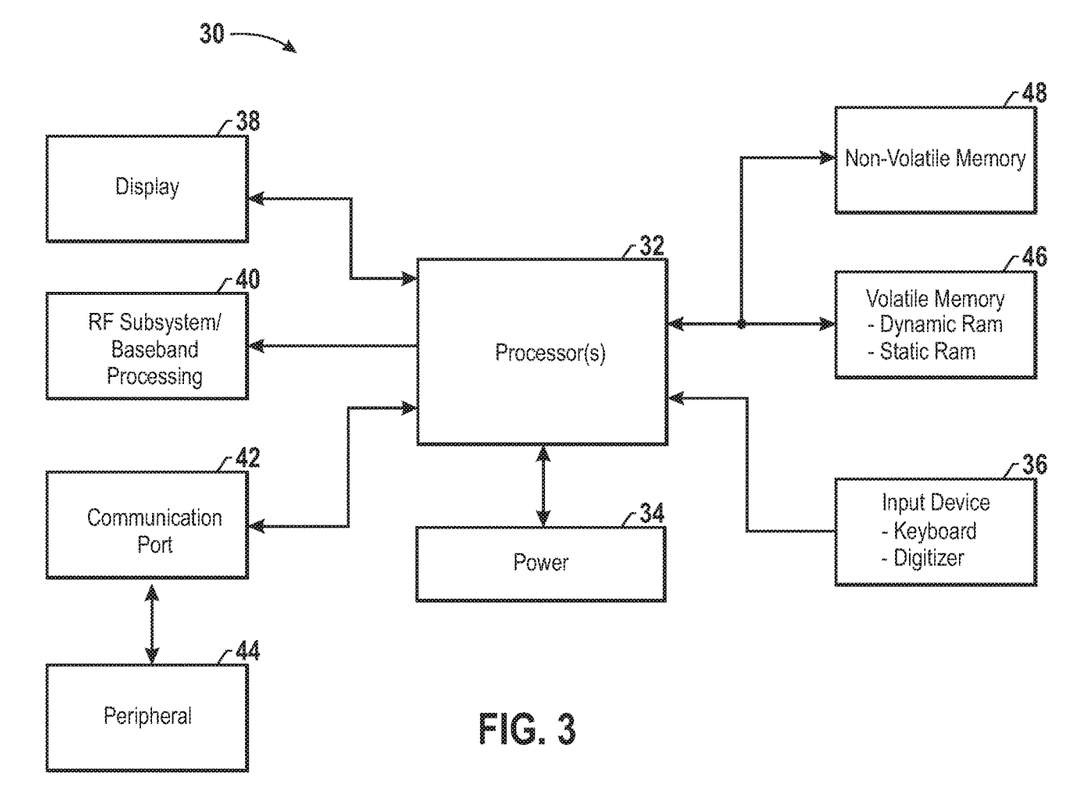
FIG. 3 illustrates a block diagram of a processor-based device in accordance with embodiments of the present invention.

Referring again to the drawings, FIG. 3 illustrates a block diagram depicting a processor-based system generally designated by reference numeral 30, in which embodiments of the invention described herein may be employed. The system 30 may be any of a variety of types such as a computer, pager, cellular phone, personal organizer, control circuit, etc. In a typical processor-based device, one or more processors 32, such as a microprocessor, control the processing of system functions and requests in the system 30. As will be appreciated, the processor 32 may include an embedded North or South bridge (not shown), for coupling each of a number of functional components thereto. Alternatively, the bridges may include separate bridges coupled between the processor 32 and the various components of the system 30.

The system 30 typically includes a power supply 34. If the system 30 is a portable system, the power supply 34 may include permanent batteries, replaceable batteries, and/or rechargeable batteries. The power supply 34 may also include an AC adapter and/or a DC adapter, so the system 30 may be plugged into a wall outlet or a vehicle cigarette lighter, for example.

Various other devices may be coupled to the processor 32 depending on the functions the system 30 is intended to perform. For instance, a user interface 36 may be coupled to the processor 32. The user interface 36 may include buttons, switches, a keyboard, a light pen, a mouse, and/or a voice recognition system, for instance. A display 38 may also be coupled to the processor 32. The display 38 may include an LCD display, a CRT, LEDs, and/or an audio display, for example. Furthermore, an RF sub-system/baseband processor 40 may also be coupled to the processor 32. The RF sub-system/baseband processor 40 may include an antenna that is coupled to an RF receiver and to an RF transmitter (not shown). One or more communication ports 42 may also be coupled to the processor 32. The communication port 42 may be adapted to be coupled to one or more peripheral devices 44 such as a modem, a printer, a computer, or to a network, such as a local area network, remote area network, intranet, or the Internet, for instance.

Because the processor 32 generally controls the functioning of the system 30 by implementing software programs, the memory is operably coupled to the processor 32 to store and facilitate execution of various programs. For instance, the processor 32 may be coupled to the memory 46 which may include Dynamic Random Access Memory (DRAM) and/or Static Random Access Memory (SRAM). The volatile memory 46 may include a number of memory modules, such as single inline memory modules (SIMMs) or dual inline memory modules (DIMMs). As can be appreciated, the memory 46 may simply be referred to as the "system memory." The memory 46 is typically quite large so that it can store dynamically loaded applications and data.

The processor 32 may also be coupled to non-volatile memory 48. The non-volatile memory 48 may include a read-only memory (ROM), such as an EPROM, and/or flash memory to be used in conjunction with the memory 46. The size of the ROM is typically selected to be just large enough to store any necessary operating system, application programs, and fixed data. Additionally, the non-volatile memory 48 may include a high capacity memory such as a tape or disk drive memory.

Figure 4:
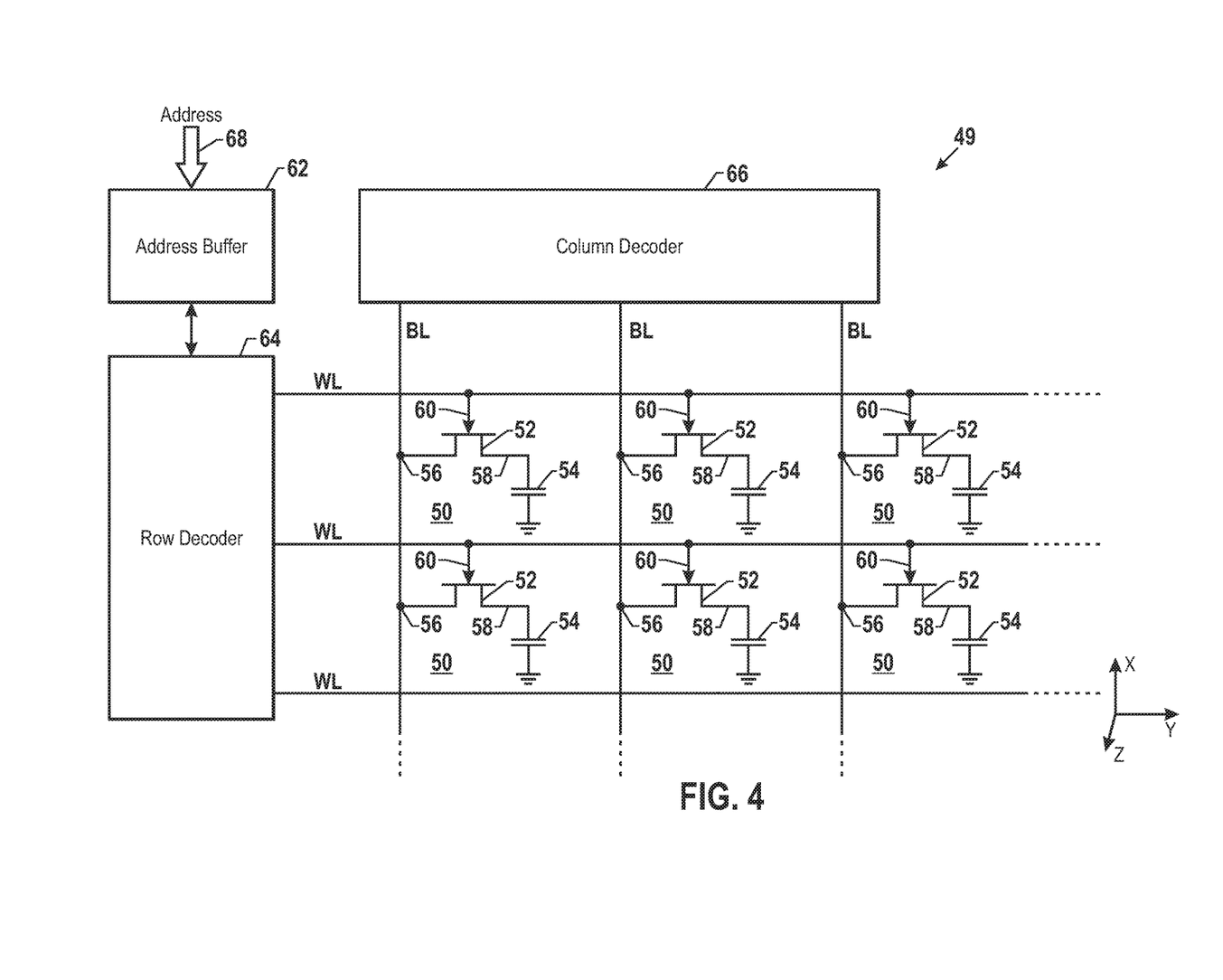
FIG. 4 is a partial schematic illustration of an integrated circuit, incorporating an array of memory cells in accordance with embodiments of the present invention.

Turning to FIG. 4, a partial schematic illustration of an integrated circuit, such as a memory device 49, which may be implemented in the memory 46, is illustrated. The memory device 49 includes an array of memory cells having transistors which may be fabricated in accordance with the techniques described herein. In the present embodiment, the memory device 49 comprises a dynamic random access memory (DRAM) device. In the embodiment, the memory device 49 includes a number of memory cells 50 arranged in a grid pattern and comprising a number of rows and columns. The number of memory cells 50 (and corresponding rows and columns) may vary depending on system requirements and fabrication technology. Each memory cell 50 includes an access device and a storage device. In the present embodiment, the access device comprises a junction field effect transistor (JFET) 52 and the storage device, such as capacitor 54. It will be understood that other types of storage devices may implemented other than capacitors. For example, phase change memory cells, resistance memory cells, magnetic memory cells, a spin-torque memory cells, etc., may be implemented. The access device is implemented to provide controlled access to the storage device. In the memory cell 50, the JFET 52 includes a drain 56 and a source 58. The capacitor 54 is coupled to the source 58. The capacitor 54 that is not coupled to the JFET 52 may be coupled to a ground plane.

It should be noted that although the above description depicts the access device coupled to the capacitor 54 as the "source" 58 and the other non-gate of the access device as the "drain" 56, during read and write operations, the JFET 52 may be operated such that each source/drain 56 and 58 operates at one time or another as a source or a drain. Accordingly, for purposes of further discussion, it should be recognized that whenever a "source" or a "drain" is identified it is only for convenience and, during operation of the JFET 52, the particular source or drain could be operate as either a source or a drain depending on the manner in which the JFET 52 is being controlled by the voltages applied to the 56, 58 and 60.

As previously described, the memory array is arranged in a series of rows and columns. To implement the data storage capabilities of a memory cell 50, an electrical charge is placed on the drain 56 of the JFET 52 via data or sense line, for example a bit line (BL). By controlling the voltage at the gate 60 via an access line, for example a word line (WL), a voltage potential may be created across the JFET 52 such that the electrical charge at the drain 56 can flow to the capacitor 54. As will be appreciated, by storing electrical charge in the capacitor 54, the charge may be interpreted as a binary data value in the memory cell 50. For instance, for a single-bit storage device, a positive charge above a known threshold voltage stored in the capacitor 54 may be interpreted as binary "1." If the charge in the capacitor 54 is below the threshold value, a binary value of "0" is said to be stored in the memory cell 50.

The BL are used to read and write data to and from the memory cells 50. The WL are used to activate the JFET 52 to access a particular row of a memory cell 50. Accordingly, the memory device 49 also includes a periphery portion which may include an address buffer 62, row decoder 64 and column decoder 66. The row decoder 60 and column decoder 66 selectively access the memory cells 50 in response to address signals that are provided on the address bus 68 during read, write and refresh operations. The address signals are typically provided by an external controller such as a microprocessor or another type of memory controller. The column decoder 66 may also include sense amplifiers and input/output circuitry to further enable data to be read to and from the memory cell 50 via the bit lines BL.

In one mode of operation, the memory device 49 receives the address of a particular memory cell 50 at the address buffer 62. The address buffer 62 identifies one of the word lines WL of the particular memory cell 50 corresponding to the requested address and passes the address to the row decoder 64. The row decoder 64 selectively activates the particular word line WL to activate the JFET's 52 of each memory cell 50 that is connected to the selected word line WL. The column decoder 66 selects the bit line (or bit lines) BL of the memory cell 50 corresponding to the requested address. For a write operation, data received by the input/output circuitry is coupled to the selected bit line (or bit lines) BL and provides for the charge or discharge of the capacitor 54 of the selected memory cell 50 through the JFET 52. The charge corresponds to binary data, as previously described. For a read operation, data stored in the selected memory cell 50, represented by the charge stored in the capacitor 54, is coupled to the select bit line (or bit lines) BL, amplified by the sense amplifier and a corresponding voltage level is provided to the input/output circuitry in the column decoder 56.

As mentioned above, conventional JFETs may have several characteristics that may preclude their use in many devices. In particular, the low diode turn-on voltage generally precludes the use of conventional JFETs as access devices. The following discussion presents JFET structures that have characteristics that allow for use of the JFET devices in memory arrays. Moreover, the JFET device structures described below have the advantage of operating at low voltages (i.e., Vcc less than 600 mV, such as less than 500 mV, for example), so they consume less power than conventional CMOS access devices and reduce leakage.

Figure 5:
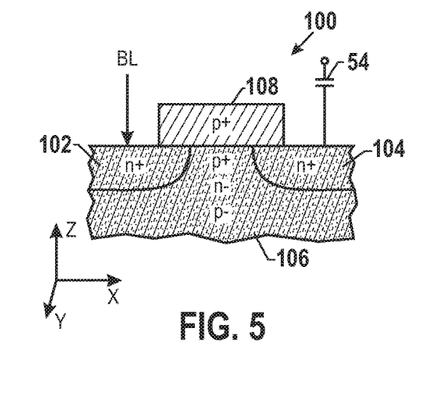
FIG. 5 illustrates an enhancement mode nJFET access device in accordance with an embodiment of the present invention.

Referring to FIG. 5, a partial schematic diagram of an enhanced mode nJFET 100 is illustrated. It will be understood that although a nJFET structure is described below, a pJFET structure can also be created to provide similar results and benefits. Indeed, all of the various embodiments disclosed herein are to be understood as specific examples of device structures that may be created as either n-channel or p-channel JFET structures.

As shown, the nJFET 100 has a source region 102 and a drain region 104, which may be formed in bulk silicon in accordance with known techniques. The source region 102 may be coupled to the bit line BL and the drain region 104 may be coupled to the capacitor 54. The source and drain regions 102 and 104 may be doped n+ regions. The nJFET 100 also has a PNP structure 106 located between the source and drain regions 102 and 104 in the bulk silicon. The PNP structure 106 includes a p− substrate region, an n− channel region, and a p+ surface region. The PNP structure allows for current flow to occur under the surface. That is, the nJFET is a buried channel device and current flows from the n+ source 102, through the n-channel, to the n+ drain 104, for example, and avoids the surface, which allows for more efficient operation, as the surface typically has defects that may adversely affect current flow.

A p+ gate 108 is formed over and in contact with the p+ surface region of the PNP structure 106. Thus, no gate oxide or spacers are used, which simplifies fabrication and may save time and resources during the manufacture of DRAM memory devices using the nJFET 100. Additionally, because the p+ gate 108 is in contact with the p+ surface region of the PNP structure 106 there is no depletion in the gate 108 when in an on-state. Thus, there is no need for a complex metal gate, which also simplifies engineering of the nJFET 100 and reduces manufacturing costs.

The nJFET 100 may also provide superior off-state leakage compared to CMOS devices, as there is no gate leakage, very low source/drain leakage, very low band-bending and, therefore no issues similar to gate induced drain leakage (GIDL). The off-state leakage of the nJFET 100 is largely determined by diffusion current rather than direct tunneling through gate dielectric and band-to-band tunneling in the bulk silicon in nanoscale CMOS devices. Also, testing of the nJFET 100 may be easier relative to the testing required on a CMOS device. Specifically, in CMOS devices, gate tunneling leakage becomes dominant rendering off-state power supply leakage level ineffective as a defect monitor. However, because direct tunneling is not dominant in the nJFET 100, the off-state leakage of the nJFET 100 may be determined by diffusion current leakage.

If a capacitor is used as a storage device, the capacitor 54 may be either a trench or stack capacitor. Specifically, the capacitor 54 may be stacked on top of the nJFET 100 in another plane or level above a diffusion region of the transistor 100. Alternatively, the capacitor 54 may be formed in a trench in the same plane as the nJFET 100. Specifically, the capacitor may be formed by etching in the silicon. Additionally, because of the low supply voltage Vcc (less than 500 mV), the capacitor 54 may be less than 20 fF. For example, the capacitor may be less than 15 femto Farads (fF), or even less than 10 fF. Typical capacitors in CMOS based DRAMs are 20 fF or higher. With the lower leakage of the nJFET 100, the smaller capacitor sizes would not negatively impact performance. That is, a sub-10 fF capacitor, when used with the nJFET 100, should be able to retain charge sufficient for the device to function.

Figure 6:
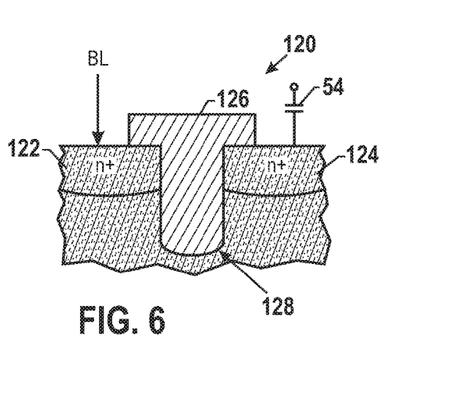
FIG. 6 illustrates a nJFET recessed access device in accordance with an embodiment of the present invention.

A nJFET recessed device 120 is illustrated in FIG. 6 in accordance with another embodiment. The nJFET recessed device 120 has source and drain regions 122 and 124, respectively which are formed on either side of a gate 126. Unlike conventional gate structures, the gate 126 of the nJFET recessed device 120 extends into a channel region 128, effectively extending the length of the channel region. That is, the channel region 128, rather than being a relatively straight conduit for the flow of electrons between the source and drain regions 122 and 124 as in a typical configuration, is extended around the edge of the gate 126. The increased channel length effectively increases the electrical separation of the source and drain regions 122 and 124. The increased electrical separation of the source and drain regions 122 and 124 reduces the leakage of the nJFET recessed device 120 relative to devices having a straight channel region.

Similar to the enhanced mode nJFET 100, no gate oxide is present so that the gate 126 interfaces directly with the channel 128. Additionally, because there is no gate dielectric, gate capacitance is nearly eliminated and does not negatively affect the timing of the device 120. As discussed above, gate capacitance is related to the speed of transistors by the following equation: $(C \times V)/I = t$; where C is the gate capacitance, V is the voltage, I is the current, and t is the time. Removal of the gate capacitance from the nJFET recessed access device 120 allows for the voltage level to be reduced to sub-500 mV levels and still provide sufficient current levels to operate the nJFET recessed access device 120.

Figure 7:
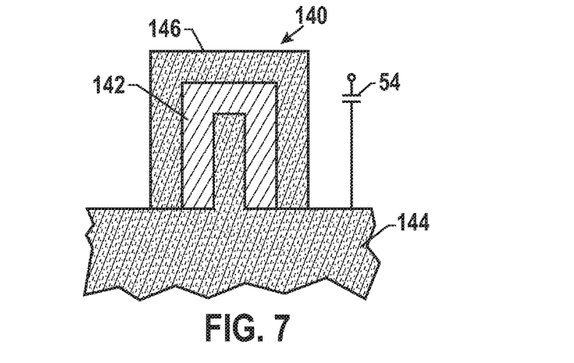
FIG. 7 illustrates a Fin-FET access device without a gate oxide in accordance with an embodiment of the present invention.

Turning to FIG. 7, a Fin-JFET structure 140 is illustrated. The Fin-JFET structure 140 is similar to other Fin-FET devices, however, the Fin-JFET 140 does not have a gate oxide. Specifically, the Fin-JFET has a gate conductor 142 formed directly over a channel 144 without a gate oxide between a channel 144 and the gate conductor 142. The terms "directly over," "directly on" and the like are used herein to indicate that materials are in physical contact, i.e., there are no intervening layers. For example, the gate conductor 142 above is described as being formed "directly over" the channel 144 to indicate that the gate conductor 142 is in physical contact with the channel 144 and there is no gate oxide present. A passivation material 146 may be formed over the gate conductor 142. Because the gate conductor 142 is directly over the channel 142 and surrounds the channel 144 on three sides, it has control over the channel region 144. The unique structure allows the Fin-JFET 140 to operate in a fully depleted mode.

Additionally, the Fin-JFET 140 has a low body effect. "Body" in "body effect" refers to the semiconductor substrate and, as such, "body effect" refers to the sensitivity of a substrate to a potential. Body effect is, therefore, related to the amount of doping in the substrate. The more dopant in the substrate, the more sensitive the substrate will be to a potential, resulting in higher body effect. High body effect reduces current flow and, thus, can lower performance. A CMOS device typically has a doping level of approximately 1e17/cm3, whereas because the Fin-JFET 140 is a fully depleted device, it may have a doping level an order of magnitude less, or approximately 1e16/cm3 or less.

Figure 8A:
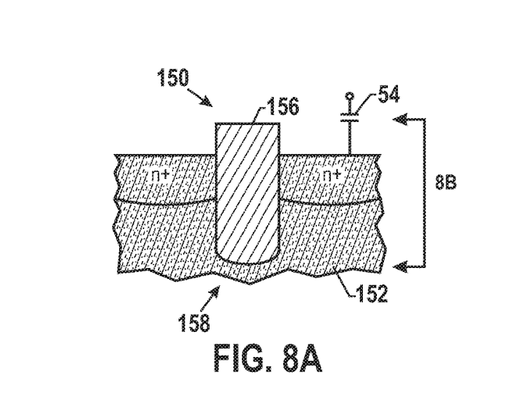
FIGS. 8A-B illustrate a RAD-Fin JFET access device in accordance with an embodiment of the present invention.
Figure 8B:
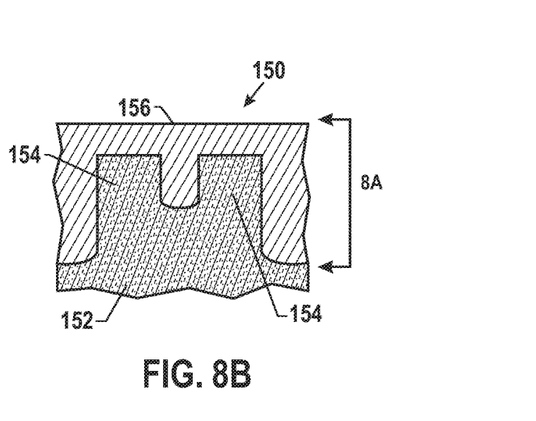

The structure of the recessed access device (RAD) (FIG. 6) and a Fin-JFET device (FIG. 7) may be combined to form a RAD-Fin device. An example of a RAD-Fin device 150 is illustrated in FIGS. 8A and 8B. FIG. 8A illustrates a cross-sectional view of the RAD-Fin device 150 along the length of a channel 152 of the RAD-Fin device 150, while FIG. 8B illustrates a cross-sectional view of the RAD-Fin device 150 along the width of the channel. As illustrated, fins 154 are part of an active area 158 of the RAD-Fin device 150 and a gate 156 extends into the active area 158 to further extend the length of the channel 152. The RAD-Fin device 150 provides advantages of both the RAD device and the Fin-JFET described above.

Figure 9:
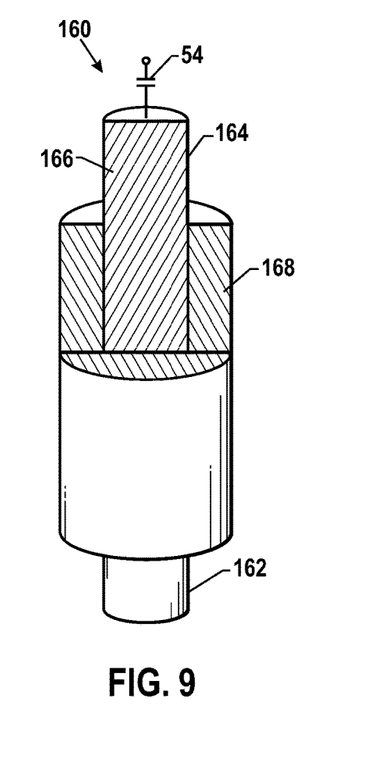
FIG. 9 illustrates a cylindrical JFET access device in accordance with an embodiment of the present invention.

In some embodiments, a cylindrical device 160, as illustrated in FIG. 9, may be created. The cylindrical device 160 includes a drain and source regions 162 and 164 extending outward from a channel region 166. The channel region 166 is completely surrounded by a gate 168. The gate 168 in this configuration has even greater control over the channel region 166 than the previously described devices as the channel 166 is completely surrounded by the gate 168. As with the other embodiments described above, there is no gate dielectric between the gate 168 and the channel 166. Additionally, similar to the Fin-JFET 140, can operate in a fully depleted mode. It should be understood that although the cylindrical device 160 is shown and described as having a cylindrical shape, alternative embodiments may take different geometric forms and still fall within the scope of this disclosure. Indeed, the cylindrical device 160 may have a cubical shape, for example, with a gate completely surrounding a channel region.

Figure 10:
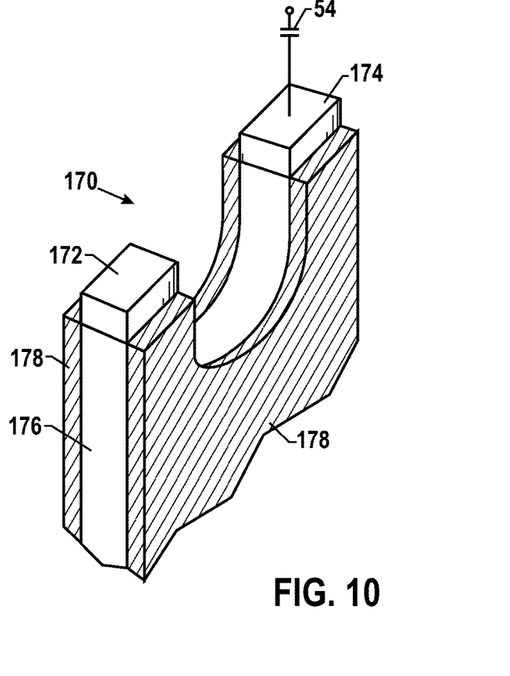
FIG. 10 illustrates an elevated source and drain Fin JFET access device in accordance with an embodiment of the present invention.

Additionally, an elevated source and drain Fin device 170, as illustrated in FIG. 10, may be created for use as an access device in a DRAM memory array. The elevated source and drain Fin device 170 includes a source region 172 and a drain region 174 located on either end of an active region 176. The active region 176 includes a Fin channel region. Specifically, the channel is formed in the active region 176, which may have a general Fin structure. In some embodiments, the active region 176 may also have a generally "u" shaped structure, as shown. A gate 178 may be formed directly on the side walls of the active region 176 without any gate oxide separating the two. Similar to the recessed access device described above, the elevated source and drain Fin device 170 extends the length of the channel and, thus, extends the electrical separation of the source and drain regions 172 and 174.

Figure 11:
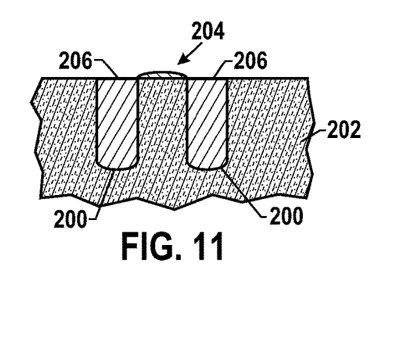
FIG. 11 illustrates shallow trench isolation in accordance with known techniques.

In addition to the JFET structures described in detail above, alternative electrical isolation techniques may be employed in a DRAM memory array operating at sub 600 mV. Conventionally, shallow trench isolation (STI) is used to isolate transistors in a DRAM array. FIG. 11 illustrates a cross section of STI trenches 200. STI essentially entails providing trenches 200 in silicon 202 around devices 204, which may be a transistor, for example. As such, STI is sometimes also referred to as "box isolation." The trenches 200 may be filled with an insulative material 206, such as an oxide, to help electrically isolate the device 204 from other devices. However, in accordance with the present techniques, STI may be eliminated. Specifically, STI may be eliminated in a deep nanoscale regime, because the low operating voltages results in lower levels of parasitic effects.

Figure 12:
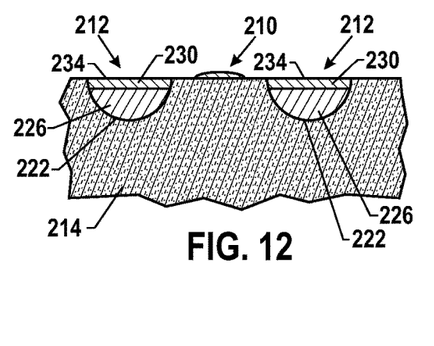
FIG. 12 illustrates diffusion based isolation in accordance with embodiments of the present invention.
Figure 13:
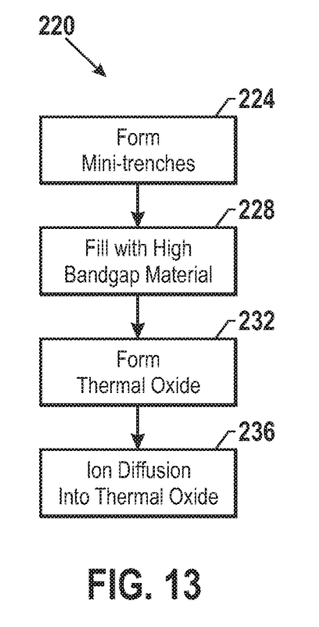
FIG. 13 is a flow chart illustrating the process for making a memory cell related to diffusion based isolation in accordance with embodiments of the present invention.

The STI may be replaced with a diffusion based isolation. FIG. 12 illustrates diffusion based isolation around a device 210. Specifically, insulative regions 212 may be created in the silicon 214 through diffusion techniques to electrically isolate the device 210 from other devices. A flow chart 220 illustrating the creation of the diffusion based insulative regions is shown in FIG. 13. The flow chart 220 will be described in conjunction with FIG. 12.

Initially, a mini-trench 222 may be created around the device 210 within the DRAM array (Block 224). The mini-trench 222 may be less than 300 Angstroms deep. The mini-trench 222 may be filled with a material 226 that has a higher bandgap than the silicon 214 (Block 228). The material 226, may be silicon carbide, for example. The high bandgap material 226 may fill the mini-trench using an oxide spacer sidewall process known in the art. In some embodiments, the high bandgap material 226 only fills the bottom of the mini-trench 222, as illustrated. Additionally, a thermal oxide 230 may be formed on the sidewalls of the mini-trench 222 to eliminate or reduce defects associated with the formation of the mini-trench 222 (Block 232). Ions 234 may be diffused into the thermal oxide 230 to create a fixed charge insulator for electrical isolation (Block 236). As an example, the insulator Aluminum oxide ($Al_2O_3$) has access negative fixed charge at the interface and may provide electrical isolation.

Figure 14:
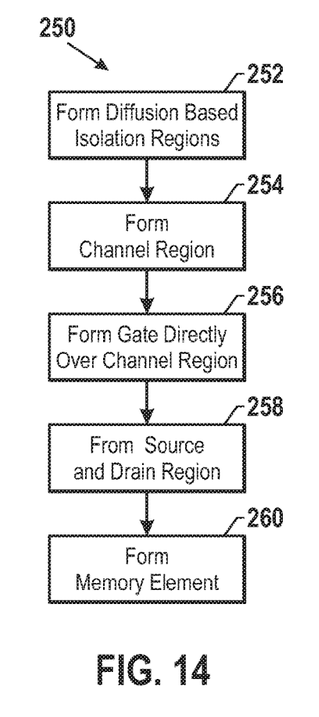
FIG. 14 is a flow chart illustrating a process for making a memory cell in accordance with embodiments of the present invention.

A general flow chart 250 of a process to create a memory cell in accordance with embodiments set forth herein is illustrated in FIG. 14. It should be understood, that certain steps set forth in the flow chart 250 may vary when applied to the particular process related to specific embodiments set forth above. Additionally, the steps may or may not be performed in the order set forth by the flow chart 250. The process may begin by forming diffusion based isolation regions, as indicated at block 252. As discussed above, the diffusion based isolation regions replace conventional STI isolation regions and can be less than 300 Angstroms deep. The diffusion based isolations regions may use a fixed charge in certain insulators for electrical isolation. As indicated in block 254, channel regions are then formed. In some embodiments, the channel regions may have a buried channel region including a PNP structure. In some embodiments, the channel region may have a "u" shape to extend the length of the channel, as discussed above.

A gate may then be formed directly over the channel region, as indicated at block 256. The absence of a gate dielectric eliminates gate capacitance and allows for lower operating voltages without sacrificing performance. Additionally, because no gate dielectric is formed during the manufacturing process, the manufacturing process may take less time and be less costly, i.e., fewer material and processing steps. In some embodiments, the gate may have a unique shape to provide increased control over the channel and/or to lengthen the channel to increase electrical separation of the source and drain, as discussed above. Source and drain regions may be formed at the ends of the channel region, as indicated at block 258. The source and drain regions may be formed in accordance with techniques known in the art.

Once the gate and source and drain regions have been formed, the memory element may be formed, as indicated at block 260. As discussed above, the memory element may be formed in the same plane as the gate or, alternatively, may be formed over a diffusion region of the transistor in a short-stack height configuration. The low operating voltages allow for smaller memory elements to be used without impacting performance. For example, sub 20 fF capacitors may be used. Accordingly, the various embodiments provide numerous advantages over conventionally used CMOS devices and allow for use of JFETs as DRAM access devices.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of manufacturing comprising:
   forming a diffusion based isolation region to electrically isolate a plurality of JFET access devices;
   forming a channel region of a JFET access device of the plurality of JFET access devices in an area created by the diffusion based isolation region;
   forming a gate of the JFET access device over and in physical contact with the channel region; and
   forming a memory element in the same plane as the gate or in a plane above the gate.

2. The method of claim 1, wherein forming a diffusion based isolation region comprises:
   forming mini-trenches;
   filling the bottom of the mini-trenches with a material having a higher bandgap than the material in which the mini-trench is formed;
   forming a thermal oxide in the mini-trench over the high bandgap material; and
   diffusing ions into the thermal oxide to create a fixed charge.

3. The method of claim 1, wherein forming the channel region comprises forming a PNP channel region.

4. The method of claim 1, wherein forming the channel region comprises forming a recessed channel region.

5. The method of claim 4, wherein forming the gate region comprises forming a gate in the recessed channel region.

6. The method of claim 1, wherein forming the channel region comprises forming a Fin channel region.

7. The method of claim 6, wherein forming the gate region comprises forming a gate that covers three sides of the channel.

8. The method of claim 1, comprising forming drain and source regions.

9. A method of manufacturing comprising:
   forming a Fin channel region of a JFET access device in a semiconductor substrate;
   forming a gate of the JFET access device directly over the Fin channel region; and
   forming a capacitive memory element electrically coupled to the JFET access device.

10. The method of claim 9, comprising forming a passivation material over the gate.

11. The method of claim 9, wherein the semiconductor substrate comprises a dopant concentration less than or equal to approximately $1e^{16}/cm^3$.

12. The method of claim 9, wherein forming the Fin channel region comprises:
    forming a recessed Fin channel region; and
    forming a plurality of Fins, and wherein forming the gate comprises forming the gate over the recessed Fin channel region and the plurality of Fins.

13. A method of manufacturing comprising:
    forming a gate of a JFET access device around a Fin channel region of the JFET access device, wherein there is no gate dielectric between the gate and the Fin channel region;
    forming a source region of the JFET access device and a drain region of the JFET access device conductively coupled to the Fin channel region; and
    forming a capacitive memory element electrically coupled to the JFET access device.

14. The method of claim 13, wherein forming the gate comprises forming a gate having a generally cylindrical shape.

15. The method of claim 13, wherein forming the gate comprises forming a gate having a generally cubical shape.

16. The method of claim 13, wherein the Fin channel region comprises a dopant concentration less than or equal to approximately $1e^{16}/cm^3$.

17. A method of manufacturing comprising:
forming a Fin channel region;
forming a gate directly on the surface of the Fin channel region, wherein the gate extends from the Fin channel region only in an x-direction; and
forming an elevated source region and an elevated drain region on the Fin channel region, wherein the elevated source region and the elevated drain region extend above the Fin channel region and above the gate only in a z-direction, and wherein the z-direction is substantially perpendicular to the x-direction and to the substrate, and the x-direction is substantially parallel to the substrate.

18. The method of claim 17, wherein forming the gate comprises forming the gate directly on two sides of the Fin channel region.

19. The method of claim 17, wherein the Fin channel region comprises a dopant concentration less than or equal to approximately $1e^{16}/cm^3$.

* * * * *